US012811231B2

(12) United States Patent
E et al.

(10) Patent No.: US 12,811,231 B2
(45) Date of Patent: Nov. 24, 2026

(54) POWER DISTRIBUTION APPARATUS, BATTERY PACK, AND VEHICLE

(71) Applicant: BYD COMPANY LIMITED, Shenzhen (CN)

(72) Inventors: Congji E, Shenzhen (CN); Jian Gao, Shenzhen (CN); Qingbo Peng, Shenzhen (CN); Zhenhan Wu, Shenzhen (CN); Chengzhi Wang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 449 days.

(21) Appl. No.: 18/621,616

(22) Filed: Mar. 29, 2024

(65) Prior Publication Data

US 2024/0239211 A1 Jul. 18, 2024

Related U.S. Application Data

(63) Continuation of application No. PCT/CN2022/132874, filed on Nov. 18, 2022.

(30) Foreign Application Priority Data

Dec. 20, 2021 (CN) ......................... 202123233795.5
Feb. 25, 2022 (CN) ......................... 202210182971.7

(51) Int. Cl.
*H01M 50/249* (2021.01)
*B60L 50/64* (2019.01)
(Continued)

(52) U.S. Cl.
CPC ....... *H01M 50/249* (2021.01); *H01M 10/425* (2013.01); *H01M 50/284* (2021.01);
(Continued)

(58) Field of Classification Search
CPC ............. H01M 50/249; H01M 50/284; H01M 10/425; H01M 2220/20; H05K 5/0026; B60L 50/64; B60R 16/133; H02B 1/24
(Continued)

(56) References Cited

U.S. PATENT DOCUMENTS

2012/0251866 A1 10/2012 Matejek et al.
2013/0099765 A1 4/2013 Girard et al.
2016/0093484 A1 3/2016 Marsh

FOREIGN PATENT DOCUMENTS

CN 206471638 U 9/2017
CN 108128180 A 6/2018
(Continued)

OTHER PUBLICATIONS

Extended European Search Report dated Jan. 28, 2025, issued in related European Patent Application No. 22909609.4 (24 pages).
(Continued)

*Primary Examiner* — Hal Kaplan
(74) *Attorney, Agent, or Firm* — Sheppard Mullin Richter & Hampton LLP

(57) ABSTRACT

A power distribution apparatus includes a base including an interface area, a high-voltage connection part and a low-voltage connection part fixed in the interface area. The power distribution apparatus further includes a high-voltage loop at least partially disposed on the base, being electrically connected with the high-voltage connection part, and having a battery positive-electrode connection end and a battery negative-electrode connection end. The components connected in the high-voltage loop is electrically connected to each other. The high-voltage loop includes a disconnecting switch core fixed on the base. A circuit board is disposed on the base, and a low-voltage loop is integrated into the circuit board. The high-voltage loop and the low-voltage connec-
(Continued)

tion part are plugged into the circuit board and electrically connected to the low-voltage loop.

20 Claims, 9 Drawing Sheets

(51) Int. Cl.
*B60R 16/033* (2006.01)
*H01M 10/42* (2006.01)
*H01M 50/284* (2021.01)
*H02B 1/24* (2006.01)
*H05K 5/00* (2025.01)

(52) U.S. Cl.
CPC ............ *H05K 5/0026* (2013.01); *B60L 50/64* (2019.02); *B60R 16/033* (2013.01); *H01M 2220/20* (2013.01); *H02B 1/24* (2013.01)

(58) Field of Classification Search
USPC ............................................................ 307/46
See application file for complete search history.

(56) References Cited

FOREIGN PATENT DOCUMENTS

| | | | |
|---|---|---|---|
| CN | 207644176 | U | 7/2018 |
| CN | 108550757 | A | 9/2018 |
| CN | 109591727 | A | 4/2019 |
| CN | 208904401 | U | 5/2019 |
| CN | 210245965 | U | 4/2020 |
| CN | 210272587 | U | 4/2020 |
| CN | 210805903 | U | 6/2020 |
| CN | 111572347 | A | 8/2020 |
| CN | 111645618 | A | 9/2020 |
| CN | 109591727 | B | 2/2021 |
| CN | 212810384 | U | 3/2021 |
| CN | 212861166 | U | 4/2021 |
| CN | 112996243 | A | 6/2021 |
| CN | 213484300 | U | 6/2021 |
| CN | 213920679 | U | 8/2021 |
| CN | 213973883 | U | 8/2021 |
| CN | 113471600 | A | 10/2021 |
| CN | 214337127 | U | 10/2021 |
| CN | 214958134 | U | 11/2021 |
| CN | 113765013 | A | 12/2021 |
| JP | 2010-130768 | A | 6/2010 |
| JP | 2012213313 | A | 11/2012 |
| JP | 2018-063922 | A | 4/2018 |
| KR | 20120061071 | A | 6/2012 |
| KR | 10-2020-0119729 | A | 10/2020 |
| WO | 2015097534 | A1 | 7/2015 |
| WO | 2018/047752 | A1 | 3/2018 |

OTHER PUBLICATIONS

Examination Report No. 1 dated Oct. 8, 2024, issued in related Australian Patent Application No. 2022422952 (4 pages).
Examination Report No. 1 dated Mar. 6, 2025, issued in related Australian Patent Application No. 2022422953 (4 pages).
Notice of Reasons for Refusal dated Jul. 1, 2025, issued in related Japanese Patent Application No. 2024-515842, with English machine translation (6 pages).
International Search Report and Written Opinion for Application No. PCT/CN2022/132874, mailed on Feb. 7, 2023, 8 pages.
Examination Report dated Apr. 22, 2026, issued in Indian Patent Application No. 202427026319, with English machine translation (7 pages).
International Preliminary Report on Patentability Chapter I for International Application No. PCT/CN2022/132834 mailed on Jul. 4, 2024.
International Preliminary Report on Patentability Chapter I for International Application No. PCT/CN2022/132874 mailed on Jul. 4, 2024.
Extended European Search Report for European Application No. 22909614.4 mailed on Jan. 21, 2025.
Notice of acceptance for Australian Application No. 2022422952 mailed on Aug. 18, 2025.
Request for the submission of an opinion for Korean Application No. 10-2024-7008163 mailed on Jul. 31, 2025.
Request for the submission of an opinion for Korean Application No. 10-2024-7009602 mailed on Aug. 8, 2025.
Notice of Reasons for Refusal for Japanese Application No. 2024-515859 mailed on Jul. 8, 2025.
Office Action for Canadian Application No. 3233292 mailed on Mar. 20, 2025.
First Office Action for Chinese Application No. 202210182971.7 mailed on Jul. 24, 2024.
Second Office Action for Chinese Application No. 202210182971.7 mailed on Oct. 1, 2024.
Notification to Grant for Chinese Application No. 202210182971.7 mailed on Dec. 1, 2024.
International Search Report and Written Opinion for Application No. PCT/CN2022/132834, mailed on Jan. 28, 2023.

POWER DISTRIBUTION APPARATUS, BATTERY PACK, AND VEHICLE

CROSS-REFERENCE TO RELATED APPLICATIONS

The application is a continuation application of International Patent Application No. PCT/CN2022/132874 filed on Nov. 18, 2022, which is based on and claims priority to and benefits of Chinese Patent Application No. 202123233795.5 filed on Dec. 20, 2021, and Chinese Patent Application No. 202210182971.7 filed on Feb. 25, 2022. The entire content of all of the above-referenced applications is incorporated herein by reference.

FIELD

The present disclosure relates to the technical field of vehicles, and more particularly, to a power distribution apparatus, a battery pack, and a vehicle.

BACKGROUND

A power distribution unit in related art usually includes a high-voltage circuit, a low-voltage circuit, a high-voltage connector, and a low-voltage connector. The high-voltage circuit usually further includes a variety of components, such as a relay, a fuse, and an HVSU (High voltage supervise unit, high voltage supervise unit). The low-voltage circuit further includes a variety of components. As a result, there are many copper bars or wire harnesses between the components in the power distribution unit, resulting in a chaotic layout, a large occupied space, low space utilization, high costs, a heavy weight, a large volume, cumbersome installation steps, and low production efficiency.

SUMMARY

The present disclosure aims to resolve at least one of the technical problems in the related art. The present disclosure proposes a power distribution apparatus that has advantages such as a simple and compact structure, high space utilization, a small volume, a light weight, low costs, versatility and high production efficiency.

The present disclosure further proposes a battery pack having the above power distribution apparatus.

The present disclosure further proposes a vehicle having the above battery pack.

According to an embodiment of a first aspect of the present disclosure, a power distribution apparatus is provided, which includes: a base, the base including an interface area, a high-voltage connection part and a low-voltage connection part being fixed in the interface area; a high-voltage loop, at least a portion of the high-voltage loop being disposed on the base, the high-voltage loop being electrically connected with the high-voltage connection part, the high-voltage loop having a battery positive-electrode connection end and a battery negative-electrode connection end, components connected in the high-voltage loop being electrically connected to each other, the high-voltage loop including a disconnecting switch core fixed on the base and the disconnecting switch core and the base forming a first module; a circuit board disposed on the base; and a low-voltage loop integrated into the circuit board, the low-voltage loop and the circuit board forming a second module, and the high-voltage loop and the low-voltage connection part being plugged into the circuit board and electrically connected to the low-voltage loop.

According to some embodiments of the present disclosure, the high-voltage loop further includes: a circuit protector disposed on the base as a third module, and being electrically connected with the disconnecting switch core.

According to some embodiments of the present disclosure, the disconnecting switch core includes: a positive disconnecting switch core, a first end terminal of the circuit protector forming the battery positive-electrode connection end, and a second end terminal of the circuit protector being electrically connected with a first end terminal of the positive disconnecting switch core; and a negative disconnecting switch core, each of a second end terminal of the positive disconnecting switch core and a first end terminal of the negative disconnecting switch core being electrically connected with the high-voltage connection part.

According to some embodiments of the present disclosure, the positive disconnecting switch core has a positive low-voltage positive-electrode connector and a positive low-voltage negative-electrode connector, and the positive low-voltage positive-electrode connector and the positive low-voltage negative-electrode connector are plugged into the circuit board and electrically connected to the low-voltage loop; and the negative disconnecting switch core has a negative low-voltage positive-electrode connector and a negative low-voltage negative-electrode connector, and the negative low-voltage positive-electrode connector and the negative low-voltage negative-electrode connector are plugged into the circuit board and electrically connected to the low-voltage loop.

According to some embodiments of the present disclosure, a positive-electrode voltage collection piece is connected between the second end terminal of the positive disconnecting switch core and the high-voltage connection part, and the positive-electrode voltage collection piece is plugged into the circuit board and electrically connected to the low-voltage loop; and a negative-electrode voltage collection piece is connected between the first end terminal of the negative disconnecting switch core and the high-voltage connection part, and the negative-electrode voltage collection piece is plugged into the circuit board and electrically connected to the low-voltage loop.

According to some embodiments of the present disclosure, the high-voltage loop further includes: a negative-electrode connector, a first end terminal of the negative-electrode connector forming the battery negative-electrode connection end, and a second end terminal of the negative-electrode connector electrically connected with the second end terminal of the negative disconnecting switch core.

According to some embodiments of the present disclosure, the negative-electrode connector includes a current sensor, and the current sensor is connected to a current collection pin, and the current collection pin is plugged into the circuit board and is electrically connected to the low-voltage loop.

According to some embodiments of the present disclosure, the circuit protector, the positive disconnecting switch core, the negative disconnecting switch core, and the negative-electrode connector are disposed along a length direction of the base; and the low-voltage connection part and the negative-electrode connector are disposed along a width direction of the base.

According to some embodiments of the present disclosure, the high-voltage loop further includes: a precharge loop, a portion of the precharge loop being integrated on the circuit board, the precharge loop including a precharge resistor and a precharge disconnecting switch, the precharge resistor being disposed on the base as a fourth module and plugged into the circuit board and electrically connected to the portion of the precharge loop integrated on the circuit board, the precharge disconnecting switch being plugged into the circuit board and electrically connected to the low-voltage loop, and the precharge resistor and the precharge disconnecting switch being connected with each other and in parallel with the disconnecting switch core, where the precharge disconnecting switch is disposed on the base as a fifth module, or the precharge disconnecting switch is fixed on the base, and the precharge disconnecting switch, the base.

According to some embodiments of the present disclosure, the precharge loop further includes: a precharge tab, a first end of the precharge tab being connected between the second end terminal of the circuit protector and the first end terminal of the positive disconnecting switch core, and a second end of the precharge tab being plugged into the circuit board and electrically connected to a portion of the precharge loop integrated on the circuit board.

According to some embodiments of the present disclosure, the precharge disconnecting switch has a precharge high-voltage positive-electrode tab, a precharge high-voltage negative-electrode tab, a precharge low-voltage positive-electrode tab, and a precharge low-voltage negative-electrode tab, the precharge low-voltage positive-electrode tab and the precharge low-voltage negative-electrode tab are plugged into the circuit board and are electrically connected to the low-voltage loop, and the precharge high-voltage positive-electrode tab and the precharge high-voltage negative-electrode tab are plugged into the circuit board and are electrically connected to a portion of the precharge loop integrated on the circuit board.

According to some embodiments of the present disclosure, the precharge resistor has a resistor high-voltage tab, the circuit protector and the precharge resistor are electrically connected to each other, and the resistor high-voltage tab is plugged into the circuit board and electrically connected to a portion of the precharge loop integrated on the circuit board; or the precharge resistor has a resistor high-voltage positive-electrode tab and a resistor high-voltage negative-electrode tab, and the resistor high-voltage positive-electrode tab and the resistor high-voltage negative-electrode tab are plugged into the circuit board and electrically connected to a portion of the precharge loop integrated on the circuit board.

According to some embodiments of the present disclosure, the precharge disconnecting switch, the precharge resistor, the positive disconnecting switch core, the negative disconnecting switch core, and the low-voltage connection part are disposed along a length direction of the base; and the precharge disconnecting switch, the precharge resistor and the circuit protector are disposed along the width direction of the base.

According to some embodiments of the present disclosure, the high-voltage connection part includes: a high-voltage positive-electrode lead-out piece disposed in the interface area of the base and electrically connected with the second end terminal of the positive disconnecting switch core; and a high-voltage negative-electrode lead-out piece disposed in the interface area of the base and electrically connected with the first end terminal of the negative disconnecting switch core.

According to some embodiments of the present disclosure, the battery positive-electrode connection end and the battery negative-electrode connection end are configured to be electrically connected to a power source by riveting; the components in the high-voltage loop are connected with each other by welding; and the high-voltage loop and the low-voltage connection part are plugged into the circuit board and welded to the circuit board.

According to some embodiments of the present disclosure, the base includes at least one accommodation cavity for accommodating components in the high-voltage loop, and at least one accommodation cavity is filled with sealant to fix components in the accommodation cavity.

According to some embodiments of the present disclosure, the base includes a sealing ring, and the sealing ring is disposed around the interface area.

According to some embodiments of the present disclosure, the circuit board is located on a first side of the base, and the interface area is located on a second side of the base opposite to the first side.

According to some embodiments of the present disclosure, the base includes an insulating component.

According to some embodiments of the present disclosure, the base includes: a base body, at least a portion of the high-voltage loop being arranged on the base body, and the circuit board being arranged on the base body; and a panel, the panel being connected to the base body, and the interface area being formed on the panel.

According to some embodiments of the present disclosure, the base body and the panel are one piece or separate pieces.

According to an embodiment of a second aspect of the present disclosure, a battery pack is provided, which includes: a housing; the power distribution apparatus according to the embodiment of the first aspect of the present disclosure, the power distribution apparatus being disposed in the housing, and the high-voltage connection part and the low-voltage connection part being exposed from the housing; and a battery module, the battery module being located in the housing and electrically connected to the battery positive-electrode connection end and the battery negative-electrode connection end.

According to an embodiment of a third aspect of the present disclosure, a vehicle is proposed, including the battery pack according to the embodiment of the second aspect of the present disclosure.

The additional aspects and advantages of the present disclosure will be provided in the following description, some of which will become apparent from the following description or may be learned from practices of the present disclosure.

BRIEF DESCRIPTION OF THE DRA WINGS

The foregoing and/or additional aspects and advantages of the present disclosure will become apparent and comprehensible from the following descriptions of the embodiments with reference to the accompanying drawings, where:

DESCRIPTIONS OF REFERENCE NUMERALS

Figure 1:
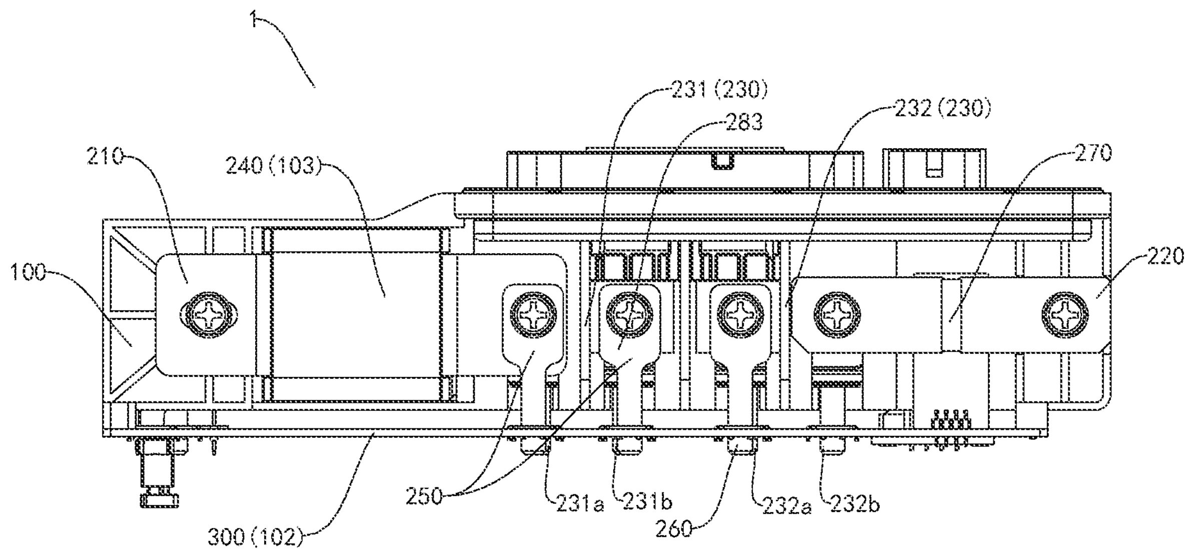
FIG. 1 is a schematic structural diagram of a power distribution apparatus according to an embodiment of the present disclosure.

1—power distribution apparatus, 2—battery pack, 3—vehicle, 101—first module, 102—second module, 103—third module, 104—fourth module, 105—fifth module, 100—base, 110—interface area, 111—high-voltage connection part, 111*a*—high-voltage positive-electrode lead-out piece, 111*b*—high-voltage negative-electrode lead-out piece, 112—low-voltage connection part, 120—accommodation cavity, 130—sealing ring, 140—base body, 150—panel, 200—high-voltage loop, 210—battery positive-electrode connection end, 220—battery negative-electrode connection end, 230—disconnecting switch core, 231—main positive disconnecting switch core, 231*a*—main positive low-voltage positive-electrode tab, 231*b*—main positive low-voltage negative-electrode tab, 232—main negative disconnecting switch core, 232*a*—main negative low-voltage positive-electrode tab, 232*b*—main negative low-voltage negative-electrode tab, 240—circuit protector, 250—positive-electrode voltage collection piece, 260—negative-electrode voltage collection piece, 270—negative-electrode connector, 271—current collection pin, 280—precharge loop, 281—precharge resistor, 282—precharge disconnecting switch, 283—precharge tab, 284—precharge high-voltage positive-electrode tab, 285—precharge high-voltage negative-electrode tab, 286—precharge low-voltage positive-electrode tab, 287—precharge low-voltage negative-electrode tab, 288—resistor high-voltage tab, 289*a*—resistor high-voltage positive-electrode tab, 289*b*—resistor high-voltage negative-electrode tab, 300—circuit board, 310—low-voltage loop, 400—battery module, and 500—housing.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are merely to explain the present disclosure and cannot be construed as a limitation to the present disclosure.

In the description of the present disclosure, it needs to be understood that the directions or positional relationships indicated by terms such as "center", "longitudinal", "horizontal", "length", "width", "thickness", "upper", "lower", "front", "rear", "left", "right", "vertical", "horizontal", "top", "bottom", "inside", "outside", "clockwise", "counter-clockwise", "axial", "radial", and "circumferential" are based on those shown in the accompanying drawings, and are only to facilitate the description of the present disclosure and simplify the description, and do not indicate or imply that the apparatus or component must have an orientation, be constructed and operated in an orientation, and therefore cannot be understood as limiting the present disclosure.

In the description of the present disclosure, "a number of" means two or more than two, and "several" means one or more.

In the present disclosure, it should be noted that unless otherwise explicitly specified and limited, the terms such as "connect" should be understood in a broad sense. For example, a connection may be a fixed connection, a detachable connection, or an integral connection; or the connection may be a mechanical connection or an electrical connection; or the connection may be a direct connection, an indirect connection through an intermediate medium, internal communication between two components, or an interaction relationship between two components. A person of ordinary skill in the art can understand meanings of the terms in the present disclosure based on situations.

The battery pack 2 according to the embodiments of the present disclosure is described below with reference to the accompanying drawings. The battery pack 2 includes a housing 500, a battery module 400, and a power distribution apparatus 1.

The power distribution apparatus 1 according to the embodiments of the present disclosure is first described with reference to the accompanying drawings.

As shown in FIG. 1 to FIG. 12, the power distribution apparatus 1 according to an embodiment of the present disclosure includes a base 100, a high-voltage loop 200, a circuit board 300 and a low-voltage loop 310.

The base 100 is configured with an interface area 110, and a high-voltage connection part 111 and a low-voltage connection part 112 are fixed in the interface area 110. At least a portion of the high-voltage loop 200 is arranged/disposed on the base 100, the high-voltage loop 200 is in contact with and is electrically connected with the high-voltage connection part 111, the high-voltage loop 200 has a battery positive-electrode connection end 210 and a battery negative-electrode connection end 220, components in the high-voltage loop 200 are in contact with and are electrically connected with each other, the high-voltage loop 200 includes a disconnecting switch core 230, the disconnecting switch core 230 is fixed on the base 100, and the disconnecting switch core and the base jointly form a first module 101. The circuit board 300 is arranged/disposed on the base 100. The low-voltage loop 310 is integrated into the circuit board 300 and the low-voltage loop and the circuit board jointly form a second module 102, and the high-voltage loop

200 and the low-voltage connection part 112 are plugged into the circuit board 300 and electrically connected to the low-voltage loop 310.

It should be noted that for the term "disconnecting switch core 230", a main disconnecting switch may include but is not limited to one or more of a relay, an IGBT (Insulated Gate Bipolar Transistor, Insulated Gate Bipolar Transistor), and a MOS field-effect transistor (Metal-Oxide-Semiconductor Field-Effect Transistor, MOSFET). "Core" refers to a portion of the main disconnecting switch that mainly implements its function, and can be understood as the internal functional component of the main disconnecting switch after removing its housing, that is, the disconnecting switch core 230 may be the remaining part after removing the housing of the main disconnecting switch. In addition, the circuit board 300 can be integrated with a battery management controller (Battery Management Controller, BMC).

In the battery pack 2 of the embodiment of the present disclosure, the power distribution apparatus 1 is provided in the housing, the high-voltage connection part 111 and the low-voltage connection part 112 are exposed from the housing, and the battery module 400 is located in the housing and is electrically connected to the battery positive-electrode connection end 210 and the battery negative-electrode connection end 220. The high-voltage connection part 111 and the low-voltage connection part 112 are exposed from the housing to connect to electrical components of the vehicle (for example, a motor, an air conditioning compressor, or a PTC (Positive Temperature Coefficient)).

For example, the high-voltage loop 200 and the low-voltage loop 310 are not directly connected to each other, and instead a transformer structure (that is, a structure that can change the voltage) is connected between the high-voltage loop 200 and the low-voltage loop 310. For example, a transformer is connected between the high-voltage loop 200 and the low-voltage loop 310. The configuration of the transformer structure can ensure that the voltage the low-voltage loop 310 is lower than the voltage in the high-voltage loop 200, and the battery module 400 can supply power to the low-voltage loop 310 through the high-voltage loop 200 and the transformer structure, to achieve the normal operation of the low-voltage loop 310.

According to the power distribution apparatus 1 of the embodiment of the present disclosure, the base 100 is configured with the interface area 110, and the high-voltage connection part 111 and the low-voltage connection part 112 are fixed in the interface area 110. The high-voltage connection part 111 and the low-voltage connection part 112 are exposed from the housing. The high-voltage connection part 111 can supply power to high-voltage electrical devices of the vehicle. The low-voltage connection part 112 can include a communication pin for communicating with a controller of the vehicle to achieve real-time control over the power distribution apparatus 1, and the low-voltage connection part 112 may also include a low-voltage plug for supplying power to low-voltage electrical devices of the vehicle. Furthermore, the base 100 can fix positions of the high-voltage connection part 111 and the low-voltage connection part 112 to the base 100, to avoid contact between the high-voltage connection part 111 and the low-voltage connection part 112 to ensure the safety of the electrical connection of the power distribution apparatus 1. The high-voltage connection part 111, the low-voltage connection part 112 and the base 100 can be designed separately to enhance connection flexibility.

Since the disconnecting switch core 230 is directly used, and the base 100 is used to fix and protect the disconnecting switch core 230. The original housing of the disconnecting switch can be removed, and the structure is simple and more compact. The low-voltage loop 310 is further integrated into the circuit board 300, such that a large number of internal copper bars and wire harnesses in the power distribution apparatus 1 can be eliminated. On this basis, combined with other settings of the power distribution apparatus 1, the stable electrical connection can be achieved while removing existing copper bars and wire harnesses, as follows.

First, since the base 100 is used to directly fix the disconnecting switch core 230, the disconnecting switch core 230 can have a sufficiently long lead-out part while the space is saved, so that the high-voltage loop 200 and the high-voltage connection part 111 can be in contact with and be electrically connected with each other, and the components in the high-voltage loop 200 can be in contact with and be electrically connected with each other, that is, the components are in contact with and are connected in the high-voltage loop 200 and between the high-voltage loop 200 and the high-voltage connection part 111, at least partially. Electrical connection is achieved through this contacting, thus eliminating the intermediate connector in the existing high-voltage loop and the intermediate connector between the high-voltage loop and the high-voltage connection part, that is, copper bars and wire harnesses in the high-voltage part.

Moreover, since the disconnecting switch core 230 can have a sufficiently long lead-out part, and the low-voltage loop 310 is integrated into the circuit board 300, the high-voltage loop 200 and the low-voltage connection part 112 can be plugged into the circuit board 300 and are electrically connected to the low-voltage loop 310, that is, the high-voltage loop 200 and low-voltage connection part 112 can be directly plugged into the circuit board 300, thereby realizing the connection between the high-voltage loop 200 and the low-voltage loop 310 and the connection between the low-voltage connection part 112 and the low-voltage loop 310. The low-voltage loop 310 on the circuit board 300 can control the connection and disconnection of the disconnecting switch core 230, which can eliminate the intermediate connectors for high and low voltage connections and the intermediate connectors between the low-voltage circuit and the low-voltage connection part, that is, the copper bar and wiring harnesses of the low-voltage part.

In this way, the electrical connections between the components of the high-voltage loop 200 and between the high-voltage loop 200 and the high-voltage connection part 111 are more reliable, the layout is clear, and it is not prone to problems such as excessive temperature rise or sintering at the connection point. The battery module 400 can supply power to the high-voltage loop 200 through the battery positive-electrode connection end 210 and the battery negative-electrode connection end 220, and the high-voltage loop 200 can supply power to high-voltage electrical components on the vehicle through the high-voltage connection part 111. By eliminating a large number of copper bars and wire harnesses in the power distribution apparatus, the layout of electrical connections in the power distribution apparatus 1 can be further simplified, thereby further reducing the volume of the power distribution apparatus 1, improving the space utilization of the power distribution apparatus 1, and reducing the weight and costs of the power distribution apparatus 1, so as to further save the space of the battery pack 2, improve the energy density of the battery pack 2 and improve the battery endurance of the entire vehicle. In addition, the base 100 can fix relative positions of the high-voltage connection part 111, the low-voltage connection part 112, the high-voltage loop 200 and the circuit board 300, and improve reliability of the electrical connection between the high-voltage loop 200 and the circuit board 300 and between the low-voltage connection part 112 and the circuit board 300.

In addition, the disconnecting switch core 230 is fixed on the base 100 and the disconnecting switch core and the base form the first module 101. The circuit board 300 is arranged/disposed on the base 100, and the low-voltage loop 310 is integrated on the circuit board 300, and the low-voltage loop and the circuit board jointly form the second module 102. In this way, the power distribution apparatus 1 is assembled in a modular manner. On the one hand, this can realize automated assembly, reduce process costs, design costs and labor costs, and improve production efficiency. On the other hand, this can improve the space utilization of the power distribution apparatus 1. The power distribution apparatus 1 is smaller, lighter and more versatile, thus saving space of the battery pack 2, improving the energy density of the battery pack 2, and improving the battery endurance of the entire vehicle.

In this way, the power distribution apparatus 1 in the embodiments of the present disclosure has advantages such as a simple and compact structure, high space utilization, a small volume, a light weight, low costs, versatility and high production efficiency.

According to the battery pack 2 of the embodiment of the present disclosure, the power distribution apparatus 1 of the above embodiment of the present disclosure is assembled in a modular manner, and has the advantages such as a small volume, a light weight, low costs, versatility and high production efficiency.

Figure 2:
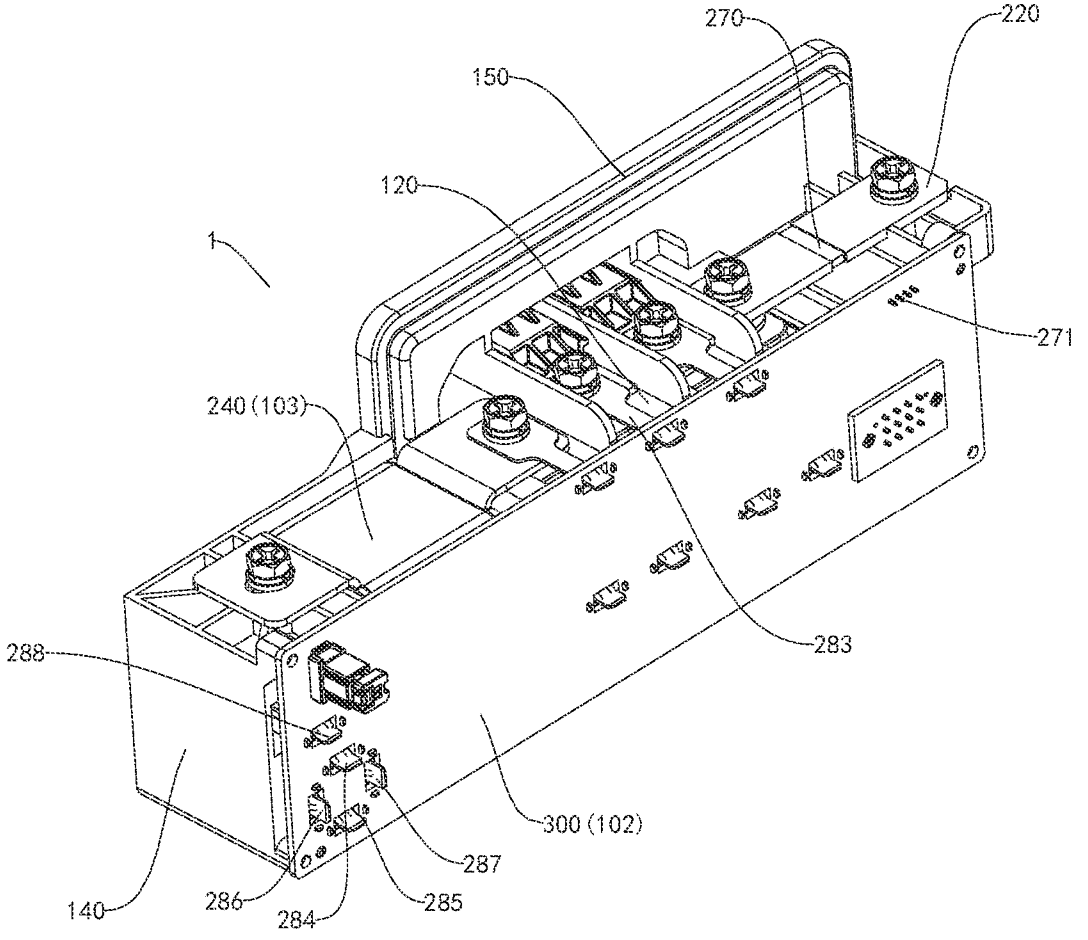
FIG. 2 is a schematic structural diagram of another perspective of a power distribution apparatus according to an embodiment of the present disclosure.
Figure 3:
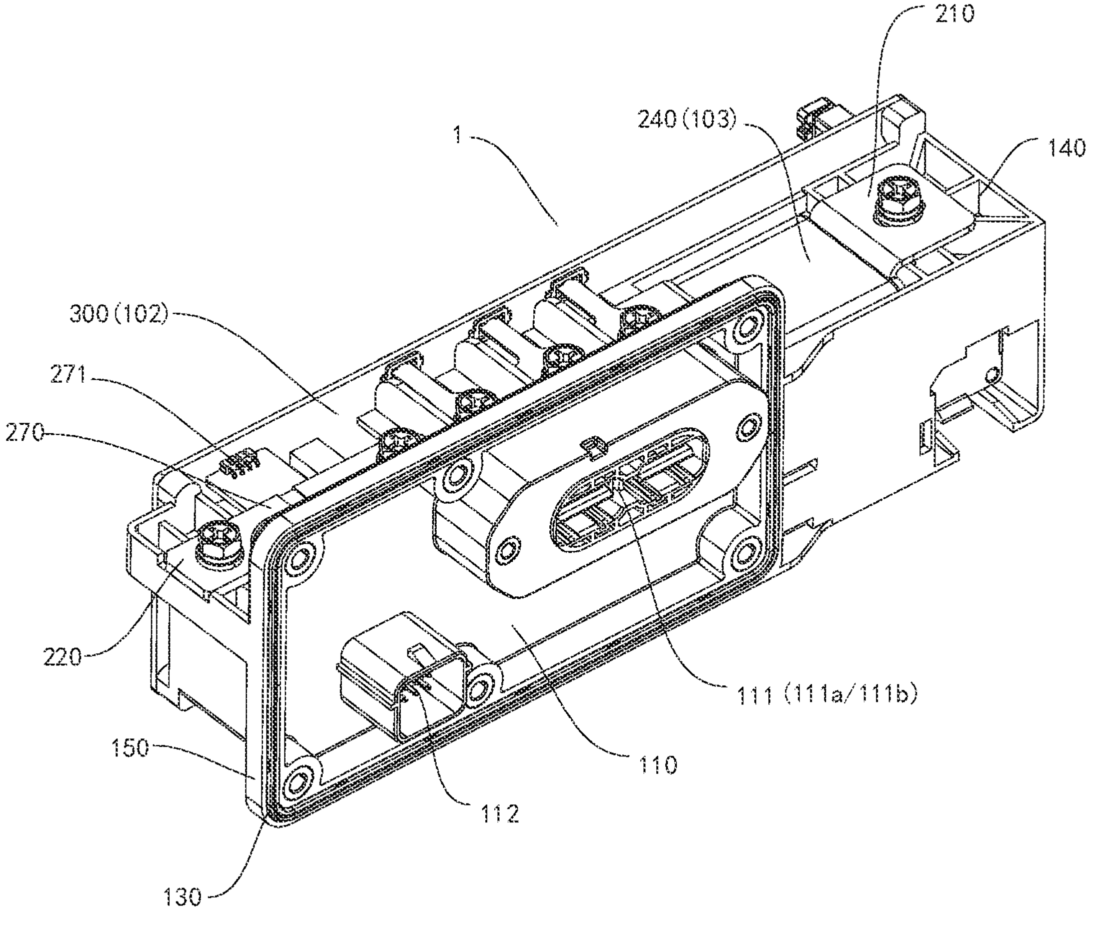
FIG. 3 is a schematic structural diagram of still another perspective of a power distribution apparatus according to an embodiment of the present disclosure.

According to some embodiments of the present disclosure, as shown in FIG. 1 to FIG. 3, the high-voltage loop 200 also includes a circuit protector 240. The circuit protector 240 is arranged/disposed on the base 100 as the third module 103, and is in contact with and is electrically connected with the disconnecting switch core 230. The circuit protector 240 may include but is not limited to one or more loop protection devices such as fuses, circuit breakers, fuses, and active fuses. By configuring the circuit protector 240, when the high-voltage loop 200 has an excessive current or voltage, the circuit protector 240 can automatically disconnect to cut off the high-voltage loop 200 in time, thereby protecting other components in the high-voltage loop 200.

In this way, there is no need to configure a conductive structure (for example, a conductive copper bar) between the circuit protector 240 and the disconnecting switch core 230. The power distribution apparatus 1 has higher space utilization, therefore has a smaller volume, a lighter weight, and lower costs. Therefore, it is conducive to improving reliability of the electrical connection between the circuit protector 240 and the disconnecting switch core 230, and it is not prone to problems such as excessive temperature rise and sintering at the connection point. In addition, the circuit protector 240 is used as the third module 103, which further improves modularity of the power distribution apparatus 1, further facilitates the automated assembly of the power distribution apparatus 1, further reduces process costs and labor costs, and improves production efficiency.

Further, as shown in FIG. 1 to FIG. 3, the high-voltage loop 200 includes multiple disconnecting switch cores 230, and the multiple disconnecting switch cores 230 include at least a main positive disconnecting switch core 231 and a main negative disconnecting switch core 232. A first end terminal of circuit protector 240 forms a battery positive-electrode connection end 210. A second end terminal of the circuit protector 240 is in contact with and is electrically connected with a first end terminal of the main positive disconnecting switch core 231. A second end terminal of the main positive disconnecting switch core 231 and a first end terminal of the main negative disconnecting switch core 232 are electrically connected with the high-voltage connection part 111.

The main positive disconnecting switch core 231 can include but is not limited to one or more of a core of a relay (that is, the relay does not need to be equipped with a housing), a core of an IGBT (that is, the IGBT does not need to be equipped with a housing), and a core of a MOS transistor (that is, the MOS transistor does not need to be equipped with a housing). The main negative disconnecting switch core 232 can include but is not limited to one or more of a core of a relay (that is, the relay does not need to be equipped with a housing), a core of an IGBT (that is, the IGBT does not need to be equipped with a housing), and a core of a MOS transistor (that is, the MOS transistor do not need to be equipped with a housing).

It should be noted that the circuit board 300 is integrated with the low-voltage loop 310, so that connection and disconnection of the main positive disconnecting switch core 231 and connection and disconnection of the main negative disconnecting switch core 232 can be controlled.

For example, the main positive disconnecting switch core 231 can control whether the high-voltage connection part 111 is connected to the battery positive-electrode connection end 210, and there is no need to configure a conductive structure (for example, a conductive copper bar or wire) between the main positive disconnecting switch core 231 and the circuit protector 240. There is no need to configure a conductive structure (for example, a conductive copper bar or wire) between the main positive disconnecting switch core 231 and the high-voltage connection part 111. This simplifies the electrical connection structure of the main positive disconnecting switch core 231, the electrical connection is reliable, the layout is simple, and it is not prone to problems such as excessive temperature rise or sintering at the connection point.

The main negative disconnecting switch core 232 can control whether the high-voltage connection part 111 is connected to the battery negative-electrode connection end 220, and there is no need to arrange a conductive structure (for example, a conductive copper bar or wire) between the main negative disconnecting switch core 232 and the high-voltage connection part 111. This simplifies the electrical connection structure of the main negative disconnecting switch core 232, the electrical connection is reliable, the layout is simple, and it is not prone to problems such as excessive temperature rise or sintering at the connection point.

When both the main positive disconnecting switch core 231 and the main negative disconnecting switch core 232 remain connected, the electrical conduction of the high-voltage loop 200 can be achieved. In this case, the battery module 400 can supply power to high-voltage electrical devices of the vehicle through the high-voltage connection part 111. Since the voltage of the current in the high-voltage loop 200 is relatively high, by configuring the main positive disconnecting switch core 231 and the main negative disconnecting switch core 232, the connection and disconnection of the main positive disconnecting switch core 231 and the main negative disconnecting switch core 232 do not interfere with each other, so that the high-voltage loop 200 can be cut off very reliably, to improve the safety of the high-voltage loop 200, thereby ensuring the safety of power supply to high-voltage electrical devices of the vehicle.

Figure 8:
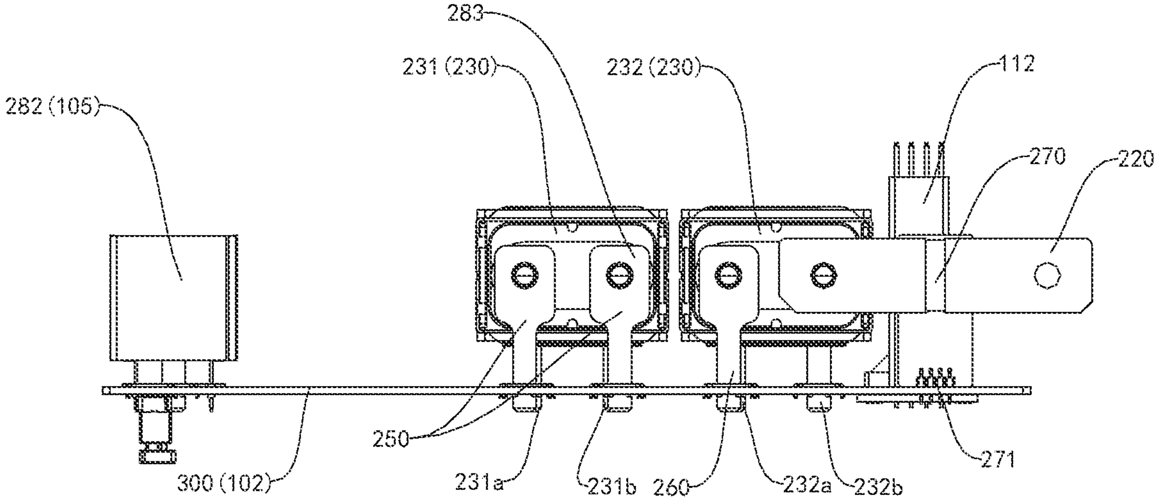
FIG. 8 is a schematic diagram of another perspective of connection between a circuit board and a high-voltage loop, a precharge loop and a low-voltage connection part of a power distribution apparatus according to an embodiment of the present disclosure.
Figure 9:
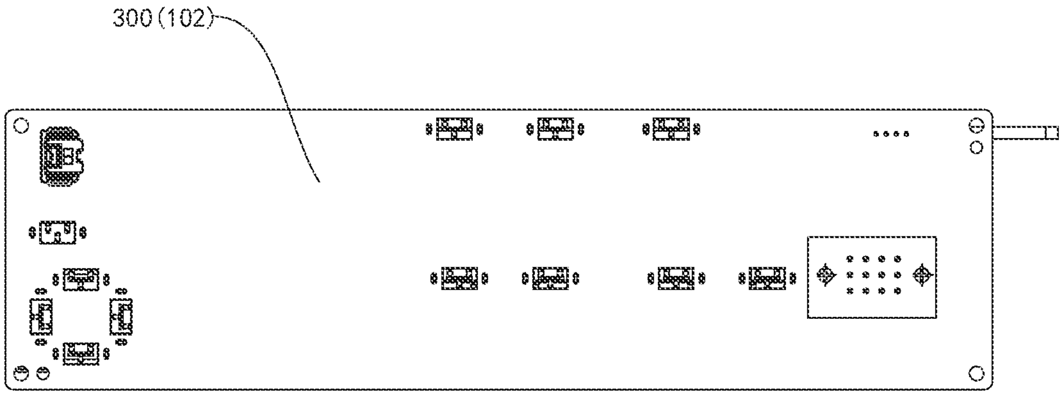
FIG. 9 is a schematic structural diagram of a circuit board of a power distribution apparatus according to an embodiment of the present disclosure.
Figure 10:
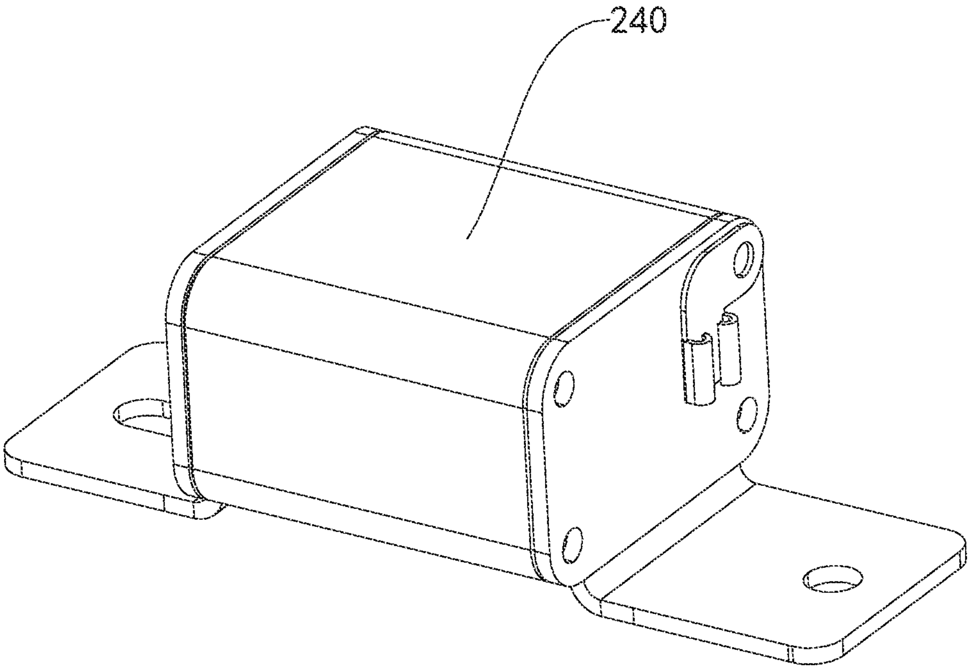
FIG. 10 is a schematic structural diagram of a circuit protector of a power distribution apparatus according to an embodiment of the present disclosure.
Figure 11:
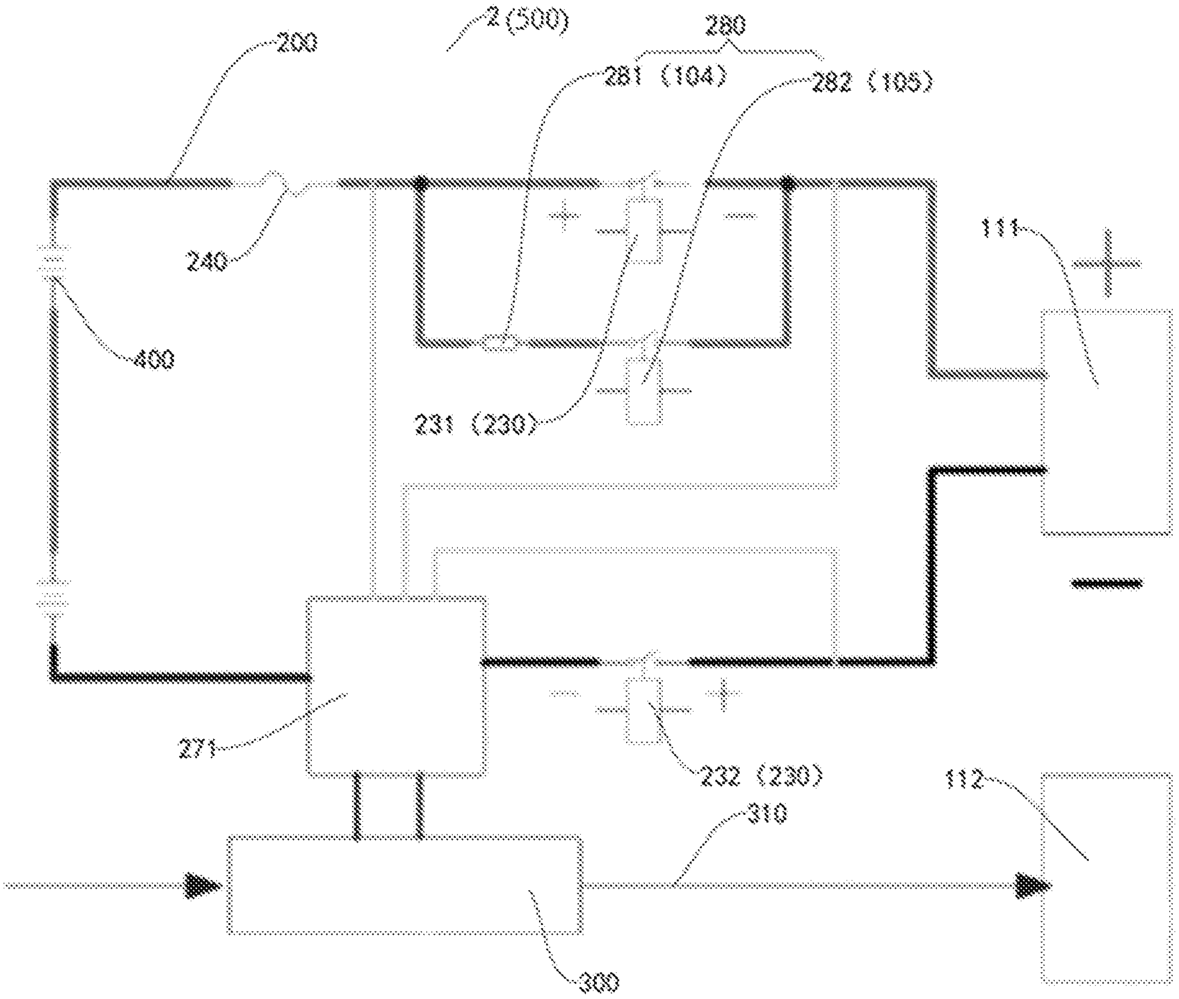
FIG. 11 is a schematic diagram of a circuit principle of a battery pack according to an embodiment of the present disclosure.

Further, as shown in FIG. 1 and FIG. 8, the main positive disconnecting switch core 231 has a main positive low-voltage positive-electrode tab 231*a* and a main positive low-voltage negative-electrode tab 231*b*. The main positive low-voltage positive-electrode tab 231*a* and the main positive low-voltage negative-electrode tab 231*b* are plugged into the circuit board 300, and electrically connected to the low-voltage loop 310. The main negative disconnecting switch core 232 has a main negative low-voltage positive-electrode tab 232*a* and a main negative low-voltage negative-electrode tab 232*b*. The main negative low-voltage positive-electrode tab 232*a* and the main negative low-voltage negative-electrode tab 232*b* are plugged into the circuit board 300 to be electrically connected to the low-voltage loop 310.

In this way, the main positive disconnecting switch core 231 and the main negative disconnecting switch core 232 may achieve electrical connection with the low-voltage loop 310 on the circuit board 300, so that the low-voltage loop 310 on the circuit board 300 can be used to control connection and disconnection of the main positive disconnecting switch core 231 and connection and disconnection of the main negative disconnecting switch core 232. Moreover, the main positive disconnecting switch core 231 is directly connected to the circuit board 300 in a plugging manner through the main positive low-voltage positive-electrode tab 231*a* and the main positive low-voltage negative-electrode tab 231*b*, which can eliminate a conductive structure (for example, a conductive copper bar or wire) between the main positive disconnecting switch core 231 and the circuit board 300, to ensure a reliable electrical connection between the main positive disconnecting switch core 231 and the circuit board 300, and to help to reduce the volume, costs, and weight of the power distribution apparatus 1.

Moreover, the main negative disconnecting switch core 232 is directly connected to the circuit board 300 in a plugging manner through the main negative low-voltage positive-electrode tab 232*a* and the main negative low-voltage negative-electrode tab 232*b*, which can eliminate a conductive structure (for example, a conductive copper bar or wire) between the main negative disconnecting switch core 232 and the circuit board 300, to ensure a reliable electrical connection between the main negative disconnecting switch core 232 and the circuit board 300, and to help to reduce the volume, costs, and weight of the power distribution apparatus 1.

Figure 7:
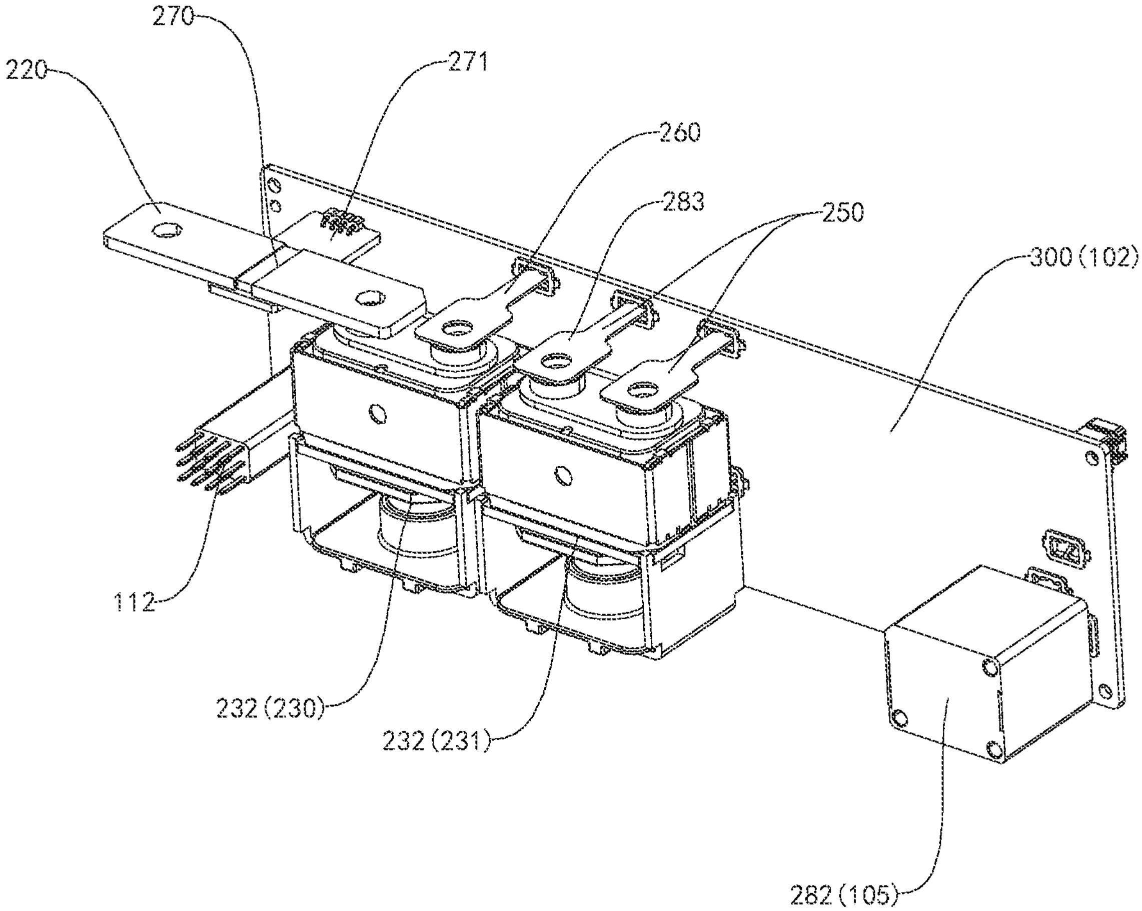
FIG. 7 is a schematic diagram of connection between a circuit board and a high-voltage loop, a precharge loop and a low-voltage connection part of a power distribution apparatus according to an embodiment of the present disclosure.

In an embodiment, as shown in FIG. 1, FIG. 7, and FIG. 8, a positive-electrode voltage collection piece 250 is disposed between the second end terminal of the main positive disconnecting switch core 231 and the high-voltage connection part 111 and is connected with the second end terminal of the main positive disconnecting switch core 231 and the high-voltage connection part 111. The positive-electrode voltage collection piece 250 is plugged into the circuit board 300 and is electrically connected to the low-voltage loop 310. A negative-electrode voltage collection piece 260 is disposed between the first end terminal of the main negative disconnecting switch core 232 and the high-voltage connection part 111 and is connected with the first end terminal of the main negative disconnecting switch core 232 and the high-voltage connection part 111. The negative-electrode voltage collection piece 260 is plugged into the circuit board 300 and is electrically connected to the low-voltage loop 310.

In this way, the circuit board 300 can collect the voltage of the high-voltage loop 200 through the positive-electrode voltage collection piece 250 and the negative-electrode voltage collection piece 260, to monitor the voltage of the high-voltage loop 200 and whether sintering occurs, which is conducive to the reliable application of the power distribution apparatus 1 and improves the safety of the power distribution apparatus 1.

In some embodiments of the present disclosure, as shown in FIG. 1 to FIG. 3, the high-voltage loop 200 also includes a negative-electrode connector 270. A first end terminal of the negative-electrode connector 270 forms the battery negative-electrode connection end 220, and a second end terminal of the negative-electrode connector 270 is in contact with and is electrically connected with the second end terminal of the main negative disconnecting switch core 232.

In this way, by the negative-electrode connector 270, the battery negative-electrode connection end 220 can be formed to achieve effective connection between the high-voltage loop 200 and the battery module 400, and there is no need to arrange a conductive structure (for example, a conductive copper bar or wire) between the negative-electrode connector 270 and the main negative disconnecting switch core 232. This not only ensures the safety of the electrical connection of the power distribution apparatus 1, but also improves the space utilization of the power distribution apparatus 1, reduces the volume of the power distribution apparatus 1, and reduces the weight and costs of the power distribution apparatus 1.

Further, as shown in FIG. 2 and FIG. 3, the negative-electrode connector 270 is a current sensor, and the current sensor is connected to a current collection pin 271, and the current collection pin 271 is plugged into the circuit board 300 and is electrically connected to the low-voltage loop 310. The current sensor can be used as a high voltage supervise unit (High voltage supervise unit, HVSU).

In this way, the circuit board 300 can collect the current of the low-voltage loop 310 through the current sensor, thereby ensuring the stability of the current of the low-voltage loop 310, to ensure reliable usage of the power distribution apparatus 1. The current sensor can be a shunt. Moreover, the current collection pin 271 is plugged into the circuit board 300 and is electrically connected to the low-voltage loop 310, so that there is no need to arrange an additional copper bar or wiring harness.

For example, as shown in FIG. 1 and FIG. 3, the circuit protector 240, the main positive disconnecting switch core 231, the main negative disconnecting switch core 232, and the negative-electrode connector 270 are arranged in sequence along the length direction of the base 100, which facilitates contacting between multiple components in the high-voltage loop 200 and is conducive to eliminating a conductive structure (for example, a conductive copper bar or wire), thereby improving the space utilization of the power distribution apparatus 1, reducing the volume and costs and weight of the power distribution apparatus 1, ensuring the reliability of the electrical connection, and avoiding damage to the high-voltage loop 200. Moreover, because the high-voltage loop 200 is mainly arranged along the length direction of the base 100, the space of the base 100 can be used more effectively.

Moreover, the low-voltage connection part 112 and the negative-electrode connector 270 are arranged along the width direction of the base 100, so that the low-voltage connection part 112 and the high-voltage loop do not need to continue to be arranged along the length of the base 100, which can reduce the length of the power distribution apparatus 1, further improve the space utilization of the power distribution apparatus 1, and reduce the weight and costs of the power distribution apparatus 1.

In some embodiments of the present disclosure, as shown in FIG. 4, FIG. 7, FIG. 8 and FIG. 11, the high-voltage loop 200 also includes a precharge loop 280. A portion of the precharge loop 280 is integrated on the circuit board 300. The precharge loop 280 includes a precharge resistor 281 and a precharge disconnecting switch 282. The precharge resistor 281 is arranged on the base 100 as the fourth module 104 and plugged into the circuit board 300 to be electrically connected to a portion of the precharge loop 280 integrated into the circuit board 300. The precharge disconnecting switch 282 is plugged into the circuit board 300 to be electrically connected to the low-voltage loop 310. The precharge resistor 281 and the precharge disconnecting switch 282 are connected to each other in series, and are in parallel with the disconnecting switch core 230. The precharge disconnecting switch 282 is arranged on the base 100 as the fifth module 105 or the precharge disconnecting switch 282 is fixed on the base 100, and the precharge disconnecting switch and the base 100 and the disconnecting switch core jointly form the first module 101.

The precharge resistor 281 and the precharge disconnecting switch 282 are connected in series to each other. After the precharge resistor 281 and the precharge disconnecting switch 282 are connected in series to each other, the precharge resistor and the precharge disconnecting switch are connected in parallel with the disconnecting switch core 230. Moreover, the precharge disconnecting switch 282 and the low-voltage loop 310 are directly connected to each other, that is, there is no need to arrange a transformer structure between the precharge disconnecting switch 282 and the low-voltage loop 310.

By configuring the precharge loop 280, the battery module 400 and the disconnecting switch core 230 can be prevented from being damaged, thus ensuring safety of the battery module 400 and the disconnecting switch core 230. The circuit board 300 can control connection and disconnection of the precharge disconnecting switch 282. Moreover, the precharge disconnecting switch 282 can be directly fixed on the base 100. There is no need to arrange an additional housing for the precharge disconnecting switch 282, which can reduce the volume of the power distribution apparatus 1 and the weight and costs of the power distribution apparatus 1.

In addition, the precharge resistor 281 serves as the fourth module 104, and the precharge disconnecting switch 282 serves as the fifth module 105 alone or is integrated into the first module 101, which can further improve the modularity of the power distribution apparatus 1. On the one hand, this can realize automated assembly, reduce process costs, design costs and labor costs, and improve production efficiency. On the other hand, this can improve the space utilization of the power distribution apparatus 1. The power distribution apparatus 1 is smaller, lighter and more versatile, thus saving space of the battery pack 2, improving the energy density of the battery pack 2, and improving the battery endurance of the entire vehicle.

In addition, the precharge resistor 281 and the precharge disconnecting switch 282 are both plugged into the circuit board 300, and there is no need to arrange a conductive structure (for example, a conductive copper bars or wire) between the precharge resistor and the circuit board 300 and between the precharge disconnecting switch and the circuit board, which can simplify the layout of the power distribution apparatus 1, reduce the volume of the power distribution apparatus 1, and improve space utilization of the power distribution apparatus 1.

The precharge resistor 281 can be a thermistor. As the thermistor is applied to the precharge loop 280, the precharge loop 280 has a simple structure, a small volume, is easy to integrate with other components, has protection capabilities against precharge overheating, and has good adaptability to the working environments and resistance ranges.

For example, the resistance of a thermistor is sensitive to temperature. When the temperature of the thermistor rises above a temperature conversion point (a Curie temperature point), the resistance rises sharply. When the thermistor is applied to the precharge loop 280, only a resistance range for normal working (between the minimum resistance and the resistance corresponding to the Curie temperature) needs to be considered. The resistance range and the allowable energy range of the thermistor can be calculated based on parameters such as a voltage, a load capacitance, a precharge completion voltage difference, and a precharge time.

The minimum resistance of the thermistor is calculated as follows: $Rmin \geq tmin/(C*\ln(UB/UB-Ut))$, the maximum resistance of the thermistor is calculated as follows: $Rmax \leq tmax/(C*\ln(UB/UB-Ut))$. tmin is the minimum precharge time, tmax is the maximum precharge time, Rmin is the minimum resistance of the thermistor, Rmax is the maximum resistance of the thermistor, C is a capacitance of a capacitive load, Ut is a corresponding terminal voltage of a capacitive load during the precharge process, and UB is a voltage of the battery module 400.

After calculating the resistance range of the thermistor, precharge time verification is performed according to a temperature-resistance property curve of the selected thermistor. Within a temperature range, such as −60° C. to 130° C., the maximum and minimum values of corresponding resistances of the thermistor within this temperature range are selected for precharge time verification.

During the precharge process of the thermistor, the maximum energy released by the precharge loop 280 to the thermistor is calculated as follows: $Ech=\frac{1}{2}CU^2$. Energy that needs to be absorbed when the temperature of a single thermistor rises from the maximum operating environment temperature Tamax to the Curie temperature Tc is Eth: $Eth=Cth*(Tc-Tamax)$, where Cth is the heat capacity (that is, energy required to increase the temperature of the thermistor body by 1K, and the unit is joule) of the thermistor.

The thermistor should maintain a low resistance state during the normal usage. Otherwise, the charging time is affected. If the energy of the charging loop is greater than the allowable energy of a single thermistor, multiple thermistors can be connected in series or in parallel for energy decomposition, to increase the circuit voltage resistance and energy tolerance capability, that is, $n*\S*Eth \geq Ech$. § is a reserve margin for safety, that is generally 0.7 to 0.9, and n is a number of thermistors used. The number of thermistors obtained through this calculation method not only meets the requirements, but also can reduce costs.

In some embodiments of the present disclosure, a resistance range of a single thermistor can be 20Ω to 200Ω, an ambient temperature range is −60° C. to 130° C., and a single withstand voltage capability can be a withstand voltage 450 VDC and below or a withstand voltage 1000 VDC and below.

The following uses an example in which when the voltage is 400 VDC, the capacitance value of the capacitive load is 800 μf, the charging voltage difference is 98%, and a response time is within 1.5 seconds. Parameters of a single thermistor are as follows: a resistance value is 70Ω, a withstand voltage is 500 VDC, a Curie temperature is 125° C., a resistance range of the thermistor is 56Ω to 112Ω within the range of −60° C. to 125° C., and thermal capacity is 2.5 J/K. The number of used thermistors can be preliminarily selected as follows:

| | capacitance | | |
|---|---|---|---|
| Voltage | 800 μF or less (including 800) | 1500 μF (800 to 1500) | 2500 μF (1500 to 2500) |
| 500 VDC | one thermistor | two thermistors in parallel | three thermistors in parallel |
| 1000 VDC | two thermistors in series | two thermistors in parallel and two thermistors in series | three thermistors in parallel and two thermistors in series |

Verification is performed based on the above formula. Precharge is completed within 180 ms to 360 ms, the safety margin can be selected as 0.8, the maximum ambient temperature is 90° C., the energy required for the thermistor to reach the Curie temperature is 70 J, and the circuit energy is 64 J, that is, a single thermistor meets the requirement and meets the expected condition.

The above is an explanation of an embodiment of the present disclosure, which is to further illustrate the practical application, and is not to limit the patent scope of the present disclosure.

Figure 4:
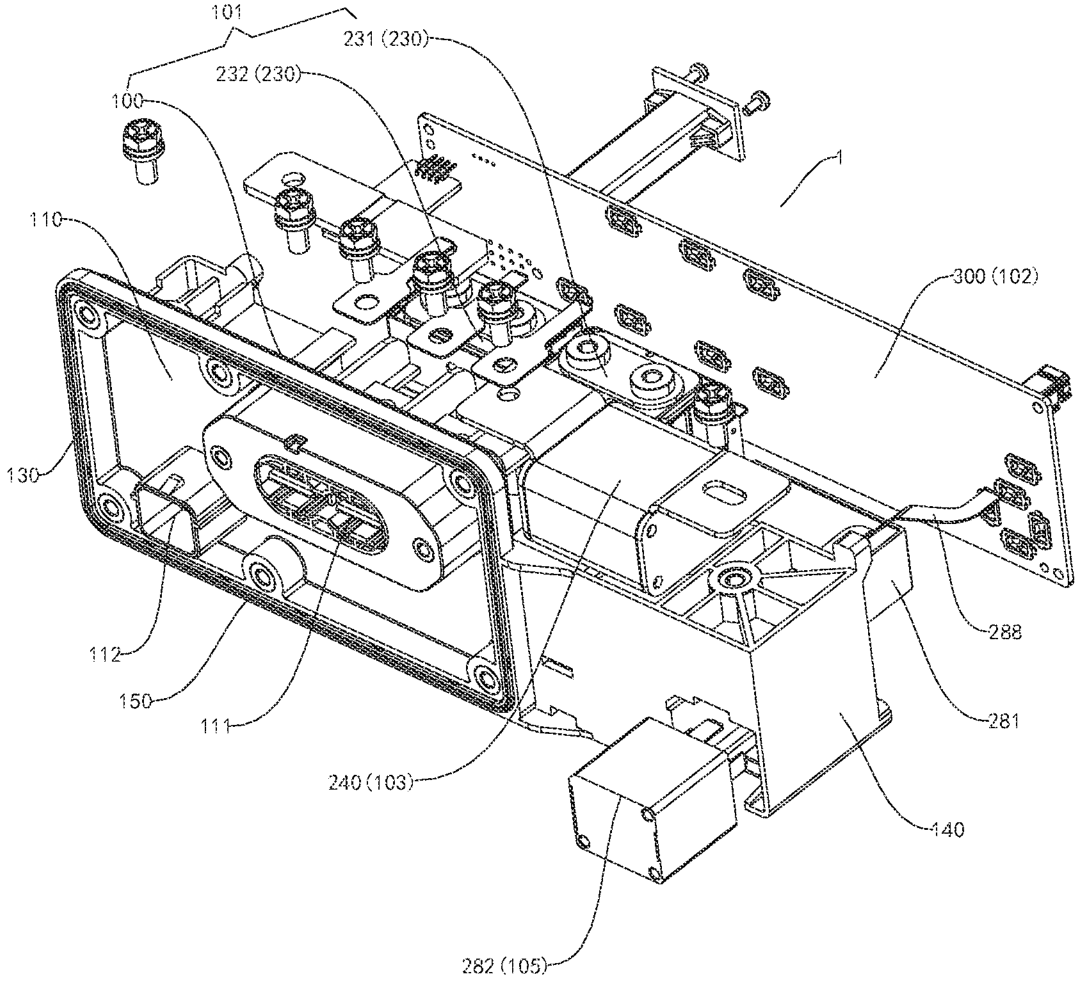
FIG. 4 is an exploded view of a power distribution apparatus according to an embodiment of the present disclosure.

Further, as shown in FIG. 4, the precharge loop 280 also includes a precharge tab 283. A first end of the precharge tab 283 is deposed between the second end terminal of the circuit protector 240 and the first end terminal of the main positive disconnecting switch core 231 and is connected with the second end terminal of the circuit protector 240 and the first end terminal of the main positive disconnecting switch core 231. A second end of the precharge tab 283 is plugged into the circuit board 300 and electrically connected to a portion of the precharge loop 280 integrated on the circuit board 300.

By configuring the precharge tab 283, the parallel connection between the precharge loop 280 and the main positive disconnecting switch core 231 can be achieved, and the precharge tab can be used to detect the voltage of the precharge loop 280. Besides, the precharge tab 283 adopts contacting and plugging methods to achieve electrical connection, and there is no need to arrange a conductive structure (for example, a conductive copper bar or wire) between the precharge tab 283 and the circuit board 300, and there is no need to arrange a conductive structure (for example, a conductive copper bar or wire) between the precharge tab 283 and the contacting position between the second end terminal of the circuit protector 240 and the first end terminal of the main positive disconnecting switch core 231, which can simplify the layout of the power distribution apparatus 1, reduce the volume of the power distribution apparatus 1, and improve the space utilization of the power distribution apparatus 1.

In an embodiment, the precharge disconnecting switch 282 has a precharge high-voltage positive-electrode tab 284, a precharge high-voltage negative-electrode tab 285, a precharge low-voltage positive-electrode tab 286, and a precharge low-voltage negative-electrode tab 287. The precharge low-voltage positive-electrode tab 286 and the precharge low-voltage negative-electrode tab 287 are plugged into the circuit board 300 to be electrically connected to the low-voltage loop 310, and the precharge high-voltage positive-electrode tab 284 and the precharge high-voltage negative-electrode tab 285 are plugged into the circuit board 300 to be electrically connected to a portion of the precharge loop 280 integrated on the circuit board 300.

Therefore, the low-voltage loop 310 can control connection and disconnection of the precharge disconnecting switch 190, and an intermediate connector between the precharge disconnecting switch and the circuit board can be eliminated, that is, the copper bars and wire harnesses of the precharge part or the like. The electrical connection between the precharge disconnecting switch 190 and the circuit board 300 is more reliable, and the layout is clear, and excessive temperature rise or sintering at a connection point is less likely to occur. The layout of electrical connections in the power distribution apparatus 1 can be further simplified, thereby further reducing the volume of the power distribution apparatus 1, improving the space utilization of the power distribution apparatus 1, and reducing the weight and costs of the power distribution apparatus 1, so as to further save the space of the battery pack 2, improve the energy density of the battery pack 2, and improve the battery endurance of the entire vehicle.

In some embodiments of the present disclosure, as shown in FIG. 2, the precharge resistor 281 has a resistor high-voltage tab 288, and the circuit protector 240 and the precharge resistor 281 are electrically connected through contact. For example, the circuit protector 240 and the precharge resistor 281 are electrically connected through buckling. The resistor high-voltage tab 288 is plugged into the circuit board 300 to be electrically connected to a portion of the precharge loop 280 integrated into the circuit board 300.

Figure 12:
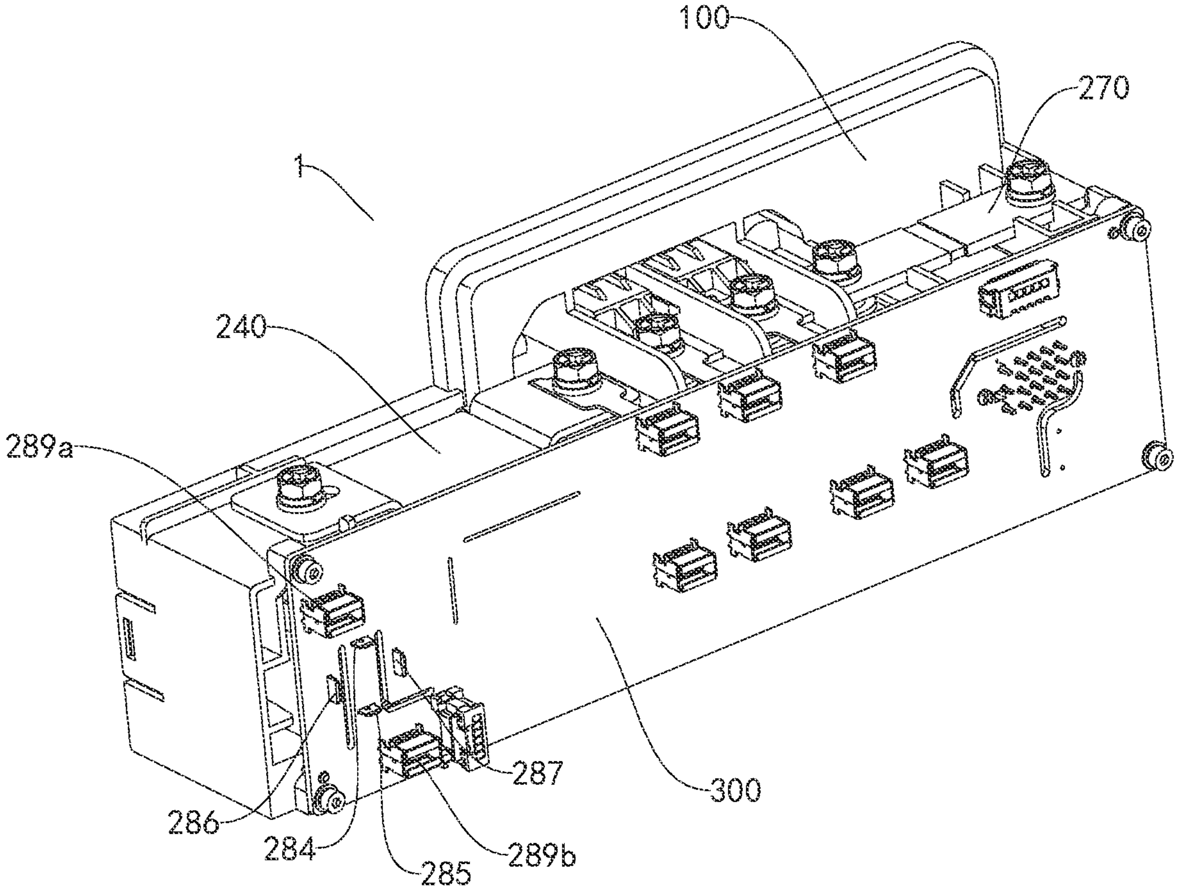
FIG. 12 is a schematic structural diagram of a power distribution apparatus according to another embodiment of the present disclosure.

In some embodiments of the present disclosure, as shown in FIG. 12, the precharge resistor 281 has a resistor high-voltage positive-electrode tab 289*a* and a resistor high-voltage negative-electrode tab 289*b*, and the resistor high-voltage positive-electrode tab 289*a* and the resistor high-voltage negative-electrode tab 289*b* are plugged into the circuit board 300 to be electrically connected to a portion of the precharge loop 280 integrated on the circuit board 300. In this case, there is no need to connect the precharge resistor 281 to the circuit protector 240, and the precharge resistor 281 and the circuit board 300 only need to be connected mechanically, which is easy to disassemble and assemble and easy to process.

In an embodiment, the precharge disconnecting switch 282, the precharge resistor 281, the main positive disconnecting switch core 231, the main negative disconnecting switch core 232, and the low-voltage connection part 112 are arranged in sequence along the length direction of the base 100. This further improves the space utilization of the base 100 and ensures reliable circuit connection of the power distribution apparatus 1. In addition, the precharge disconnecting switch 282, the precharge resistor 281 and the circuit protector 240 are arranged along the width direction of the base 100, so that any two of the precharge disconnecting switch 282, the precharge resistor 281, and the circuit protector 240 are staggered in the length direction of the base 100, which can reduce the length of the base 100 to a certain extent, thereby reducing the volume of the power distribution apparatus 1.

In some embodiments of the present disclosure, the high-voltage connection part 111 includes a high-voltage positive-electrode lead-out piece and a high-voltage negative-electrode lead-out piece. The high-voltage positive-electrode lead-out piece is arranged in the interface area 110 of the base 100, and is in contact with and is electrically connected with the second end terminal of the main positive disconnecting switch core 231. The high-voltage negative lead-out piece is arranged in the interface area 110 of the base 100, and is in contact with and is electrically connected with the first end terminal of the main negative disconnecting switch core 232.

By arranging the high-voltage positive-electrode lead-out piece and the high-voltage negative-electrode lead-out piece, the electrical connection between the high-voltage connection part 111 and the high-voltage loop 200 can be achieved to ensure that the high-voltage connection part 111 can supply power to high-voltage electrical components of the vehicle. In addition, the high-voltage connection part 111 is in contact with and electrically connected with the disconnecting switch core 230 through the high-voltage positive lead-out piece and the high-voltage negative lead-out piece, and there is no need to arrange a conductive structure (for example, a conductive copper bar or wire). The electrical connection between the high-voltage connection part 111 and the high-voltage loop 200 is more reliable and this can further simplify the layout of electrical connection within the power distribution apparatus 1, thereby further reducing the volume of the power distribution apparatus 1 and improving the space utilization of the power distribution apparatus 1, and reducing the weight and costs of the power distribution apparatus 1, so as to further save the space of the battery pack 2, improve the energy density of the battery pack 2, and improve battery endurance of the entire vehicle.

In some embodiments of the present disclosure, as shown in FIG. 1 to FIG. 4, the battery positive-electrode connection end 210 and the battery negative-electrode connection end 220 are configured to be electrically connected to the battery module 400 through riveting (for example, pull riveting and expansion riveting), which facilitates subsequent replacement and maintenance. Components connected in the high-voltage loop 200 are in contact with each other and are welded to each other, and the high-voltage loop 200 and the low-voltage connection part 112 are plugged into the circuit board 300 and welded to the circuit board 300 (for example, laser welding, EPMT welding, ultrasonic wave welding, and soldering).

In this way, compared with the existing connection method using bolts, the electrical connection between the battery positive-electrode connection end 210 and the battery negative-electrode connection end 220 and the battery module 400 is reliable, and the reliability does not decrease with the increase in usage time or the vibration of the vehicle. The electrical connection between the high-voltage loop 200 and the low-voltage connection part 112 and the circuit board 300 is also more reliable, avoiding excessive temperature rise within the power distribution apparatus 1 or sintering at the circuit connection point.

Figure 5:
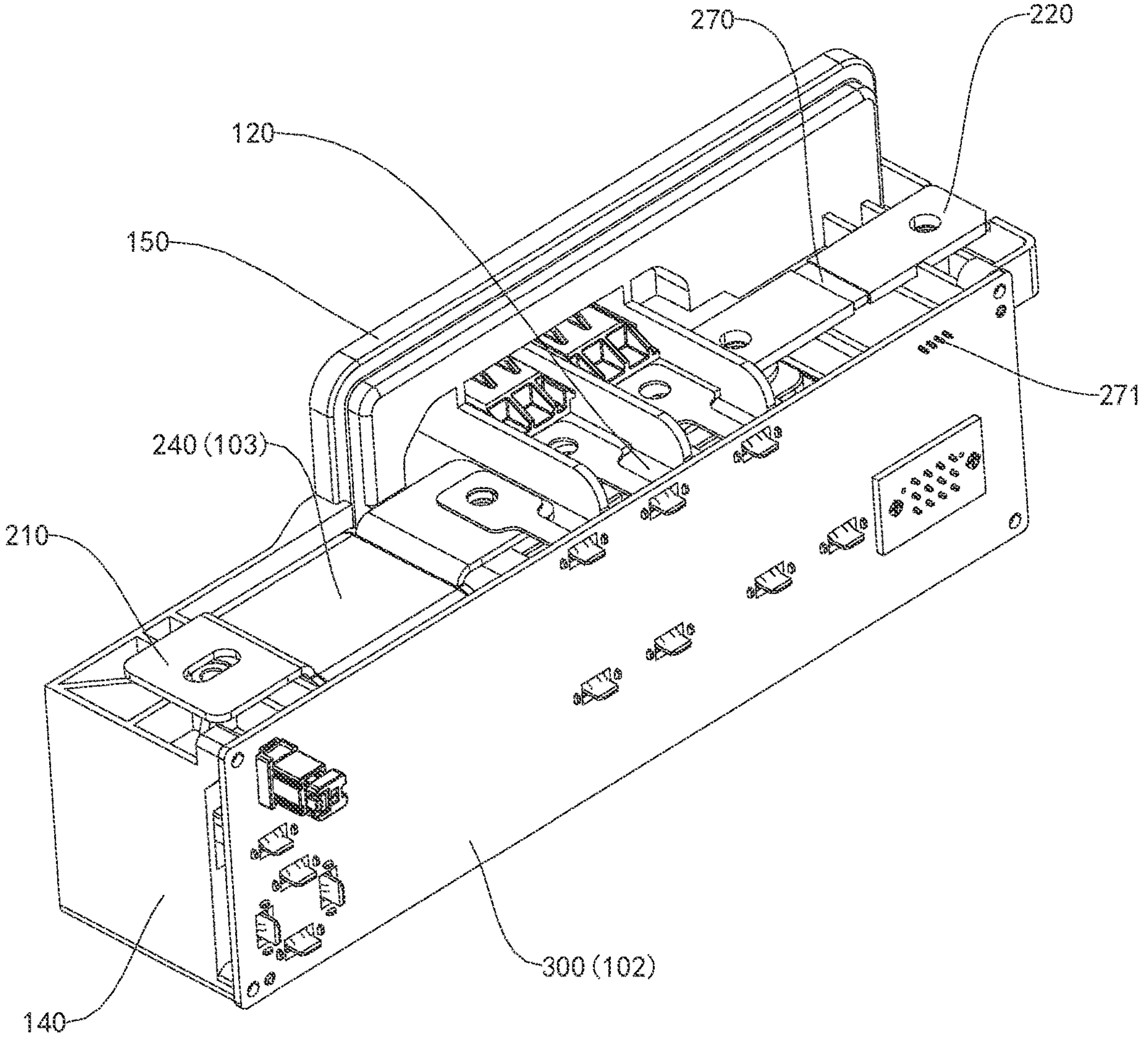
FIG. 5 is a schematic structural diagram of a high-voltage loop, a positive-electrode voltage collection piece, a negative-electrode voltage collection piece and a circuit protector in a power distribution apparatus that are not riveted according to an embodiment of the present disclosure.

According to some embodiments of the present disclosure, as shown in FIG. 2 and FIG. 5, the base 100 is configured with at least one accommodation cavity 120 for accommodating components in the high-voltage loop 200, and at least one accommodation cavity 120 is filled with sealant to fix components in the accommodation cavity 120. In this way, the connection strength between the high-voltage loop 200 and the base 100 is higher, which can prevent the components of the high-voltage loop 200 from moving with respect to the base 100, to improve the reliability of the electrical connection in the power distribution apparatus 1.

Figure 6:
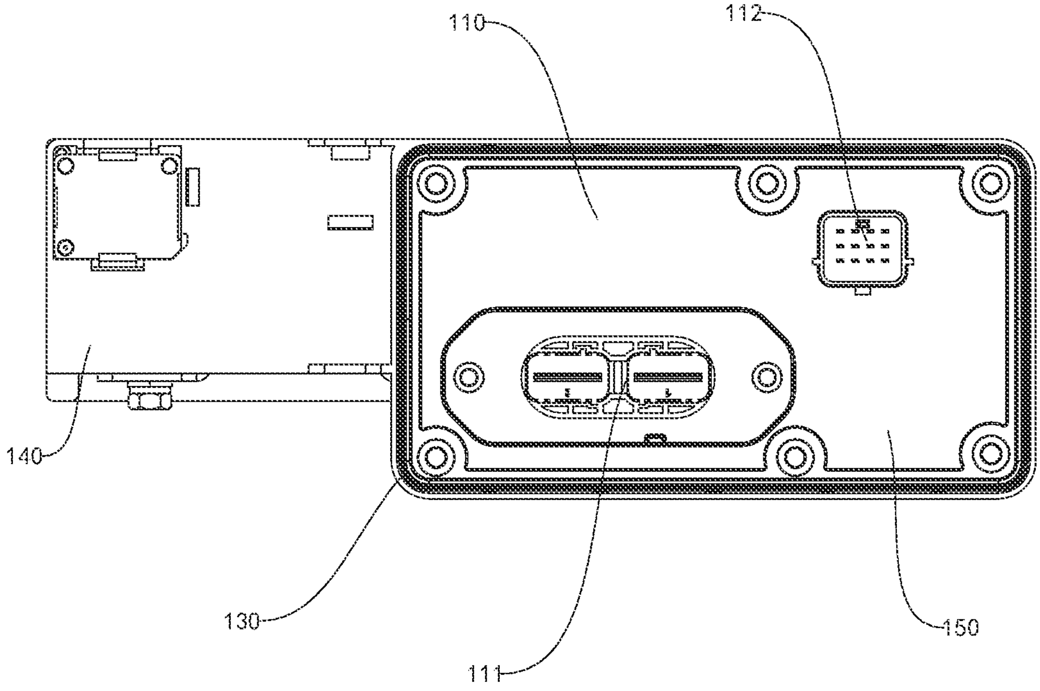
FIG. 6 is a schematic structural diagram of an interface area of a power distribution apparatus according to an embodiment of the present disclosure.

In some embodiments of the present disclosure, as shown in FIG. 2, FIG. 4, and FIG. 6, the base 100 is provided with a sealing ring 130, and the sealing ring 130 is arranged around the interface area 110, where the sealing ring 130 is elastic and can be made of a rubber material or a silicone material. In this way, impurities such as liquid and dust in the external space cannot enter the power distribution apparatus 1 through the interface area 110, which improves the tightness of the power distribution apparatus 1, reduces the corrosion rate of the high-voltage loop 200, the circuit board 300, and the low-voltage loop 310, and ensures reliability of the electrical connection of the power distribution apparatus 1.

In some embodiments of the present disclosure, as shown in FIG. 4, the circuit board 300 is located on one side in the thickness direction of the base 100, and the interface area 110 is located on the other side in the thickness direction of the base 100, which increases the distance between the circuit board 300 and the interface area 110. The high-voltage loop 200 and the low-voltage loop 310 can be arranged between the circuit board 300 and the interface area 110. Both the high-voltage loop 200 and the low-voltage loop 310 can be conveniently connected to the circuit board 300 and can also be conveniently connected to the high-voltage connection part 111 and the low-voltage connection part 112, to ensure that the power distribution apparatus 1 is conveniently arranged and small in volume, which is conducive to the lightweight setting of the power distribution apparatus 1.

In some embodiments of the present disclosure, the base 100 is an insulating piece, and the base 100 can be an insulating plastic. This can avoid a short circuit between the base 100 and each of the high-voltage loop 200, the circuit board 300, and the low-voltage loop 310, and improve the circuit safety of the power distribution apparatus 1.

In some embodiments of the present disclosure, as shown in FIG. 2 to FIG. 6, the base 100 includes a base body 140 and a panel 150, at least a portion of the high-voltage loop 200 is arranged on the base body 140, the circuit board 300 is arranged on the base body 140, the panel 150 is connected to the base body 140, and the interface area 110 is formed on the panel 150. This can ensure the structural strength of the base body 140, and ensure the stable arrangement of the high-voltage loop 200 and the circuit board 300. In addition, the base 100 is divided into two parts, which not only facilitates the processing and manufacturing of the base body 140 and the panel 150, but also facilitates arrangement of the high-voltage loop 200, the circuit board 300 and the low-voltage loop on the base 100.

The base body 140 and the panel 150 may be one piece or separate pieces. It should be noted that when the base body 140 and the panel 150 are one piece, the base body 140 and the panel 150 can be manufactured separately first. Then, the base body 140 and the panel 150 are formed into one piece to facilitate arrangement of the high-voltage loop 200, the circuit board 300, and the low-voltage loop 310. In an embodiment, the base body 140 and the panel 150 are directly molded once to improve the connection strength between the base body 140 and the panel 150. In this way, the setting methods of the base 100 are more diverse, so that the structure of the base 100 can be adjusted according to different usage situations, the applicability of the base 100 can be improved, and the power distribution apparatus 1 can meet the needs of different usage environments.

An assembly process of the power distribution apparatus 1 according to the embodiments of the present disclosure is described below with reference to examples.

First, potting glue is used to fix the main positive disconnecting switch core 231 and the main negative disconnecting switch core 232 in the base 100 to form the first module 101.

Then, the precharge resistor 281 is mounted on the base 100 as the fourth module 104, and the precharge disconnecting switch 282 is mounted on the base as the fifth module 105.

Next, the circuit protector 240 is placed on the base 100 as the third module 103 and is electrically connected to the precharge resistor 281 through buckling, and bolts are used to fix the positive-electrode voltage collection piece 250, the negative-electrode voltage collection piece 260, and the negative-electrode connector 270. The circuit board 300 is fixed on the base 100. At the same time, the tabs are aligned and plugged, and the low-voltage connection part 112 on the circuit board 300 is inserted into a hole reserved on the base 100. For example, the tabs include a main positive low-voltage positive-electrode tab 231*a*, a main positive low-voltage negative-electrode tab 231*b*, a main negative low-voltage positive-electrode tab 232*a*, a main negative low-voltage negative-electrode tab 232*b*, a positive-electrode voltage collection piece 250, a negative-electrode voltage collection piece 260, a current collection pin 271, and a precharge tab 283.

Finally, the sealing ring 130 is placed on the base 100.

Figure 13:
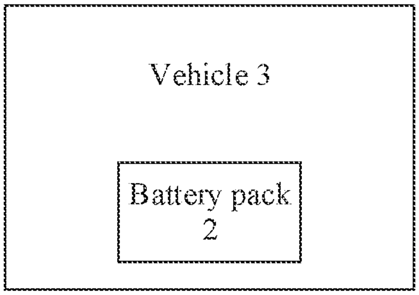
FIG. 13 is a schematic structural diagram of a vehicle according to an embodiment of the present disclosure.

A vehicle 3 according to the embodiments of the present disclosure is described below with reference to FIG. 13, and includes the battery pack 2 according to the embodiments of the present disclosure. In some embodiments of the present disclosure, the vehicle further includes a load (such as a motor) connected to the battery pack. This battery pack is configured to supply power to the load.

In the vehicle according to this embodiment of the present disclosure, the battery pack 2 in the embodiments of the present disclosure is used, which has advantages such as a simple and compact structure, high space utilization, a small volume, a light weight, low costs, versatility and high production efficiency.

Other configurations and operations of the power distribution apparatus 1, the battery pack 2, and the vehicle 3 according to the embodiments of the present disclosure are known to those of ordinary skill in the art and will not be described in detail herein.

In the description of this specification, description of reference terms such as "a specific embodiment" or "a specific example", means including features, structures, materials, or features described in the embodiment or example in at least one embodiment or example of the present disclosure. In this specification, exemplary descriptions of the foregoing terms do not necessarily refer to the same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A power distribution apparatus, comprising:

a base, the base having an interface area, a high-voltage connection part and a low-voltage connection part being fixed in the interface area;

a high-voltage loop, at least a portion of the high-voltage loop being disposed on the base, the high-voltage loop being electrically connected with the high-voltage connection part, the high-voltage loop having a battery positive-electrode connection end and a battery negative-electrode connection end, components connected in the high-voltage loop being electrically connected to each other, and the high-voltage loop comprising a disconnecting switch core fixed on the base;

a circuit board disposed on the base; and a low-voltage loop integrated into the circuit board, and the high-voltage loop and the low-voltage connection part being plugged into the circuit board and electrically connected to the low-voltage loop.

2. The power distribution apparatus according to claim 1, wherein the high-voltage loop further comprises:

a circuit protector disposed on the base and electrically connected with the disconnecting switch core.

3. The power distribution apparatus according to claim 2, wherein the disconnecting switch core comprises:

a positive disconnecting switch core, a first end terminal of the circuit protector forming the battery positive-electrode connection end, and a second end terminal of the circuit protector being electrically connected with a first end terminal of the positive disconnecting switch core; and a negative disconnecting switch core, each of a second end terminal of the positive disconnecting switch core and a first end terminal of the negative disconnecting switch core being electrically connected with the high-voltage connection part.

4. The power distribution apparatus according to claim 3, wherein the positive disconnecting switch core has a positive low-voltage positive-electrode connector and a positive low-voltage negative-electrode connector, and the positive low-voltage positive-electrode connector and the positive low-voltage negative-electrode connector are plugged into the circuit board and electrically connected to the low-voltage loop; and the negative disconnecting switch core has a negative low-voltage positive-electrode connector and a negative low-voltage negative-electrode connector, and the negative low-voltage positive-electrode connector and the negative low-voltage negative-electrode connector are plugged into the circuit board and electrically connected to the low-voltage loop.

5. The power distribution apparatus according to claim 3, wherein a positive-electrode voltage collection piece is connected between the second end terminal of the positive disconnecting switch core and the high-voltage connection part, and the positive-electrode voltage collection piece is plugged into the circuit board and electrically connected to the low-voltage loop; and a negative-electrode voltage collection piece is connected between the first end terminal of the negative disconnecting switch core and the high-voltage connection part, and the negative-electrode voltage collection piece is plugged into the circuit board and electrically connected to the low-voltage loop.

6. The power distribution apparatus according to claim 3, wherein the high-voltage loop further comprises:

a negative-electrode connector, a first end terminal of the negative-electrode connector forming the battery negative-electrode connection end, and a second end terminal of the negative-electrode connector electrically connected with the second end terminal of the negative disconnecting switch core.

7. The power distribution apparatus according to claim 6, wherein the negative-electrode connector comprises a current sensor, and the current sensor is connected to a current collection pin, and the current collection pin is plugged into the circuit board and is electrically connected to the low-voltage loop.

8. The power distribution apparatus according to claim 6, wherein the circuit protector, the positive disconnecting switch core, the negative disconnecting switch core, and the negative-electrode connector are disposed along a length direction of the base; and the low-voltage connection part and the negative-electrode connector are disposed along a width direction of the base.

9. The power distribution apparatus according to claim 3, wherein the high-voltage loop further comprises:

a precharge loop, a portion of the precharge loop being integrated on the circuit board, the precharge loop comprising a precharge resistor and a precharge disconnecting switch, the precharge resistor being disposed on the base and plugged into the circuit board and electrically connected to the portion of the precharge loop integrated on the circuit board, the precharge disconnecting switch being plugged into the circuit board and electrically connected to the low-voltage loop, and the precharge resistor and the precharge disconnecting switch being connected with each other and in parallel with the disconnecting switch core, wherein:

the precharge disconnecting switch is disposed on the base, or the precharge disconnecting switch is fixed on the base.

10. The power distribution apparatus according to claim 9, wherein the precharge loop further comprises:

a precharge tab, a first end of the precharge tab being connected between the second end terminal of the circuit protector and the first end terminal of the positive disconnecting switch core, and a second end of the precharge tab being plugged into the circuit board and electrically connected to the portion of the precharge loop integrated on the circuit board.

11. The power distribution apparatus according to claim 9, wherein the precharge disconnecting switch has a precharge high-voltage positive-electrode tab, a precharge high-voltage negative-electrode tab, a precharge low-voltage positive-electrode tab, and a precharge low-voltage negative-electrode tab, the precharge low-voltage positive-electrode tab and the precharge low-voltage negative-electrode tab are plugged into the circuit board and are electrically connected to the low-voltage loop, and the precharge high-voltage positive-electrode tab and the precharge high-voltage negative-electrode tab are plugged into the circuit board and are electrically connected to the portion of the precharge loop integrated on the circuit board.

12. The power distribution apparatus according to claim 9, wherein:

the precharge resistor has a resistor high-voltage tab, the circuit protector and the precharge resistor are electrically connected to each other, and the resistor high-voltage tab is plugged into the circuit board and electrically connected to the portion of the precharge loop integrated on the circuit board; or the precharge resistor has a resistor high-voltage positive-electrode tab and a resistor high-voltage negative-electrode tab, and the resistor high-voltage positive-electrode tab and the resistor high-voltage negative-electrode tab are plugged into the circuit board and electrically connected to the portion of the precharge loop integrated on the circuit board.

13. The power distribution apparatus according to claim 9, wherein the precharge disconnecting switch, the precharge resistor, the positive disconnecting switch core, the negative disconnecting switch core, and the low-voltage connection part are disposed along a length direction of the base; and the precharge disconnecting switch, the precharge resistor and the circuit protector are disposed along a width direction of the base.

14. The power distribution apparatus according to claim 3, wherein the high-voltage connection part comprises:

a high-voltage positive-electrode lead-out piece disposed in the interface area of the base and electrically connected with the second end terminal of the positive disconnecting switch core; and a high-voltage negative-electrode lead-out piece disposed in the interface area of the base and electrically connected with the first end terminal of the negative disconnecting switch core.

15. The power distribution apparatus according to claim 1, wherein the battery positive-electrode connection end and the battery negative-electrode connection end are configured to be electrically connected to a power source by riveting;

the components in the high-voltage loop are connected with each other by welding; and the high-voltage loop and the low-voltage connection part are plugged into the circuit board and welded to the circuit board.

16. The power distribution apparatus according to claim 1, wherein the base comprises at least one accommodation cavity for accommodating the components in the high-voltage loop, and the at least one accommodation cavity is filled with sealant to fix the components in the accommodation cavity.

17. The power distribution apparatus according to claim 1, wherein the base comprises a sealing ring, and the sealing ring is disposed around the interface area.

18. The power distribution apparatus according to claim 1, wherein the circuit board is located on a first side of the base, and the interface area is located on a second side of the base opposite to the first side.

19. A battery pack, comprising:

a housing;

a power distribution apparatus, comprising:

a base, the base having an interface area, a high-voltage connection part and a low-voltage connection part being fixed in the interface area;

a high-voltage loop, at least a portion of the high-voltage loop being disposed on the base, the high-voltage loop being electrically connected with the high-voltage connection part, the high-voltage loop having a battery positive-electrode connection end and a battery negative-electrode connection end, components connected in the high-voltage loop being electrically connected to each other, and the high-voltage loop comprising a disconnecting switch core fixed on the base;

a circuit board disposed on the base; and a low-voltage loop integrated into the circuit board, and the high-voltage loop and the low-voltage connection part being plugged into the circuit board and electrically connected to the low-voltage loop;

the power distribution apparatus being disposed in the housing, and the high-voltage connection part and the low-voltage connection part being exposed from the housing; and a battery module, the battery module being located in the housing and electrically connected to the battery positive-electrode connection end and the battery negative-electrode connection end.

20. A vehicle, comprising a battery pack, wherein the battery pack comprises:

a housing;

a power distribution apparatus, comprising:

a base, the base having an interface area, a high-voltage connection part and a low-voltage connection part being fixed in the interface area;

a high-voltage loop, at least a portion of the high-voltage loop being disposed on the base, the high-voltage loop being electrically connected with the high-voltage connection part, the high-voltage loop having a battery positive-electrode connection end and a battery negative-electrode connection end, components connected in the high-voltage loop being electrically connected to each other, and the high-voltage loop comprising a disconnecting switch core fixed on the base;

a circuit board disposed on the base; and a low-voltage loop integrated into the circuit board, and the high-voltage loop and the low-voltage connection part being plugged into the circuit board and electrically connected to the low-voltage loop;

the power distribution apparatus being disposed in the housing, and the high-voltage connection part and the low-voltage connection part being exposed from the housing; and a battery module, the battery module being located in the housing and electrically connected to the battery positive-electrode connection end and the battery negative-electrode connection end.

* * * * *